United States Patent [19]
Lee

[11] Patent Number: 6,130,558
[45] Date of Patent: Oct. 10, 2000

[54] DATA TRANSFER CIRCUIT AND METHOD FOR A SEMICONDUCTOR MEMORY

[75] Inventor: Jung-bae Lee, Gunpo, Rep. of Korea

[73] Assignee: Samsung Electronics, Co., Ltd., Suwon, Rep. of Korea

[21] Appl. No.: 09/104,152

[22] Filed: Jun. 23, 1998

[30] Foreign Application Priority Data

Jun. 23, 1997 [KR] Rep. of Korea .................. 97-26473

[51] Int. Cl.[7] .................. H03K 19/00; H03K 19/096
[52] U.S. Cl. .................. 326/93; 326/96; 326/82; 365/233
[58] Field of Search .................. 326/93, 96, 82, 326/86, 90; 365/233; 327/291

[56] References Cited

U.S. PATENT DOCUMENTS

| | | | |
|---|---|---|---|
| 4,829,485 | 5/1989 | Hatanaka et al. | 365/239 |
| 5,627,795 | 5/1997 | Nitta | 365/233 |
| 5,915,105 | 6/1999 | Farmwald et al. | 395/309 |
| 5,973,520 | 10/1999 | Maruyana | 327/108 |
| 5,995,443 | 11/1999 | Farmwald et al. | 365/233 |

*Primary Examiner*—Michael Tokar
*Assistant Examiner*—Daniel D. Chang
*Attorney, Agent, or Firm*—Marger Johnson & McCollom, P.C.

[57] ABSTRACT

A circuit and method are described for transferring data in a semiconductor memory in synchronism with a reference clock. A data transfer circuit according to the invention includes a non-overlapping clock generator, a data output circuit, and a data input circuit. The non-overlapping clock generator generates a plurality of non-overlapping clock signals, each of which is active during a different time interval during a period of one external clock cycle. The data output circuit selects and outputs a selected one of a plurality of internal data signals in response to an active one of the non-overlapping clock signals. The data input circuit then receives the selected one of the internal data signals and outputs it to the semiconductor memory in response to the active one of the non-overlapping clock signals. By utilizing a non-overlapping clock generator to produce multiple clock pulses during a single external clock cycle, each of which triggers data transfer, data processing speed and operation rate is improved. Detrimental increase in power consumption, which normally results from an increase in the operation rate within the circuit, is reduced by removing the need for multiple input receivers.

23 Claims, 7 Drawing Sheets

DATA TRANSFER CIRCUIT AND METHOD FOR A SEMICONDUCTOR MEMORY

BACKGROUND OF THE INVENTION

1. Field of the Invention

The present invention relates to a circuit for the input and output of data in a semiconductor memory as well as a method therefor. More particularly, this invention relates to a circuit and method for the transfer of data in a synchronous semiconductor memory which is capable of generating a plurality of data words during each cycle of a reference clock signal and transmitting the generated data words to the synchronous semiconductor memory.

2. Description of the Related Art

Modern computer systems generally use a synchronous semiconductor memory as a main memory, driven by a system or reference clock signal, in order to increase an operation rate of the memory. Furthermore, the synchronous semiconductor memory of the modern computer system typically employs a double data rate (DDR) method for transmitting and receiving data, which uses both a rising and a falling edge of one reference clock signal to further increase a processing rate of memory data.

By using the DDR method, two or more data words may be processed during one reference clock cycle tCC. In accordance with the modern computer system design, the synchronous semiconductor memory processes various internal data in synchronism with the reference clock. This is important not only in order to increase an operating margin of the semicondutor memory but also to increase the speed at which memory data is processed.

Utilizing the DDR method, one half of the reference clock cycle tCC (i.e., tCC/2), is a bit time of each data word which is being externally transmitted. The semiconductor memory generally includes two lines having the bit time of tCC, in which the data on one line is processed according to the rising edge of the reference clock signal CLK and the data on the other line is processed according to the falling edge of the reference clock signal CLK.

FIG. 1 is a schematic showing a data transfer circuit for a synchronous semiconductor memory according to the prior art. According to this conventional circuit design, data is transferred to and from the memory according to data paths. For example, a data path in a read mode employs a multiplexer 101 and a driver 103. The multiplexer 101 selects between the two internal data lines according to reference clock signals CLK and /CLK. The driver 103 is, in turn, driven by a signal output from the multiplexer 101 and thereby produces a corresponding output signal.

A data path in a write mode employs two data receivers 105 and 107. The data receivers 105 and 107 each receive an external data input signal corresponding to the output signal from the driver 103, and are activated according to the reference clock signals CLK and/CLK, respectively. Within the memory, particularly within DRAM-type memory, a circuit design which minimizes operation current of the data receivers is extremely important.

FIG. 2 is a schematic illustrating one example of a data receiver 105 or 107, as seen in FIG. 1, according to the prior art. The operation of this conventional data receiver is as follows. When a first control signal SAMPLE, comprising the external data input signal described above, rises to high, path transistors 201 and 203 are turned on. The path transistors 201 and 203 are thus activated, and a charge received from a reference terminal REFERENCE VOLTAGE and a pad PAD through the path transistors 201 and 203 is stored in terminals 205 and 207, respectively. When the first control signal SAMPLE then falls to low, the path transistors 201 and 203 are turned off, and a pull-up transistor 211 of a latch 209 is simultaneously turned on. When a second control signal SENSE then rises to high, a pull-down transistor 213 of the latch 209 is turned on, thereby amplifying the charge stored in the terminals 205 and 207. The amplified data is then received by another memory circuit (not shown).

Power consumption is a tremendous concern in a semiconductor memory.

Unfortunately, the data receivers depicted in FIGS. 1 and 2 consume a certain amount of power when in use. Furthermore, according to the conventional art, one data receiver is required for each data word being processed during one reference clock cycle. Accordingly, as the number of processed data words per clock cycle increases, the number of data receivers needed increases, and power consumption increases. The industry is therefore in need of an efficient circuit and method for transferring data to and from a semiconductor memory which is capable of processing multiple data words during a single clock cycle with reduced power consumption.

SUMMARY OF THE INVENTION

According to the needs of the industry, it is an object of the present invention to enable an efficient circuit and method for the transfer of data to and from a semiconductor memory which allows for multiple data exchanges within a single reference clock cycle.

It is a further object of the present invention to enable a circuit and method for the transfer of data to and from a semiconductor memory having reduced power consumption even as the number of data words being processed per clock cycle increases.

In order to accomplish the objects of the present invention, a data transfer circuit includes a non-overlapping clock generator which generates a plurality of non-overlapping clock signals, each of which is active during a different time interval; a data output circuit which selectively outputs one of a plurality of internal data signals in response to each of the non-overlapping clock signals; a conductor, being connected to the output of the data output circuit; and a data input circuit having an input connected to the conductor, the data input circuit selectively receiving data signals from the conductor in response to the non-overlapping clock signals.

A method for the input and output of data from a semiconductor memory includes the steps of: generating a plurality of non-overlapping clock signals, each of which is active during a different time interval; selecting one of a plurality of data signals in response to each of the non-overlapping clock signals; transmitting the selected data signal to another circuit; and selectively receiving the selected data signal in response to the non-overlapping clock signals.

BRIEF DESCRIPTION OF THE DRAWINGS

The above objects and advantages of the present invention will become more apparent through a detailed description of the preferred embodiments thereof with reference to the attached drawings in which.

DESCRIPTION OF THE PREFERRED EMBODIMENTS

Figure 1:
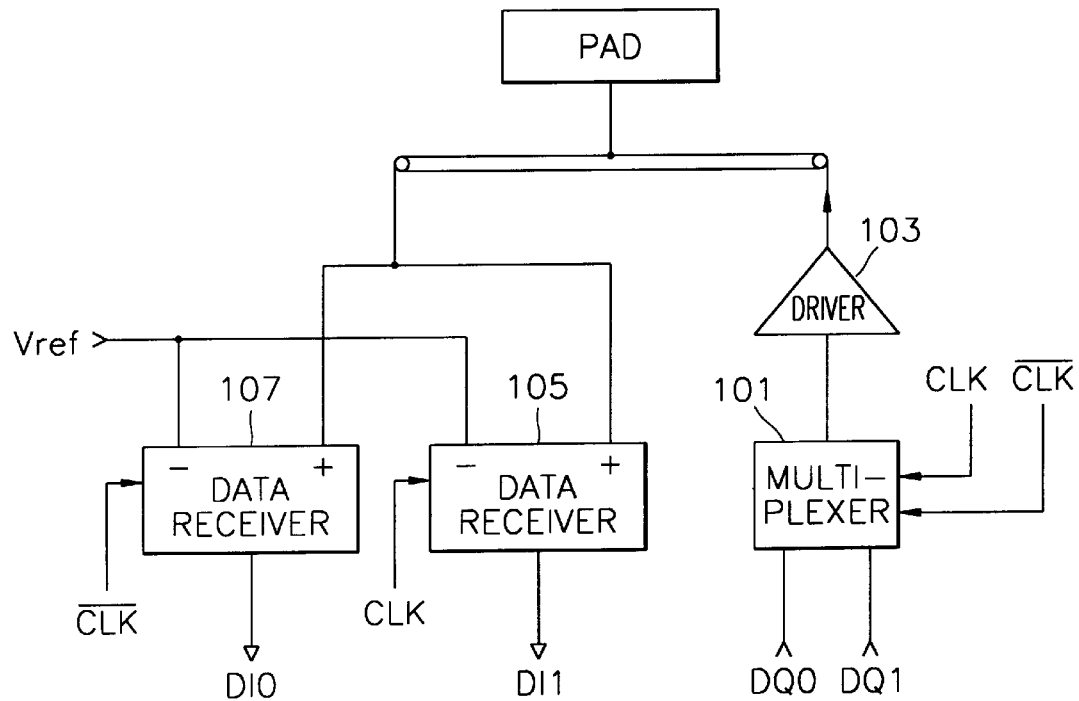
FIG. 1 is a schematic diagram of a conventional data transfer circuit as found in the prior art.
Figure 2:
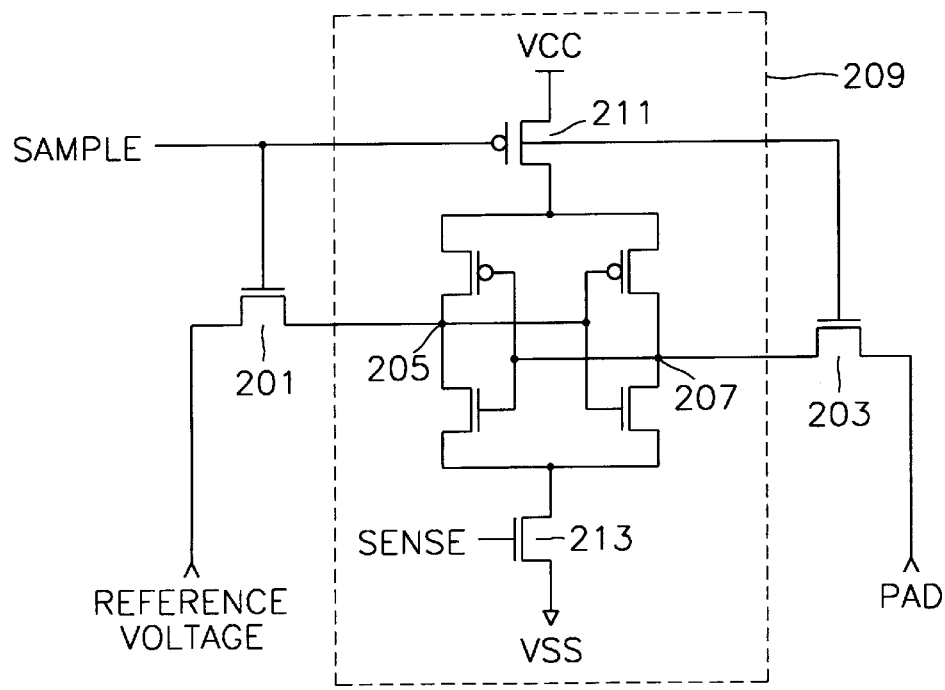
FIG. 2 is a schematic diagram showing a data receiver of the conventional data transfer circuit shown in FIG. 1 according to the prior art.
Figure 3:
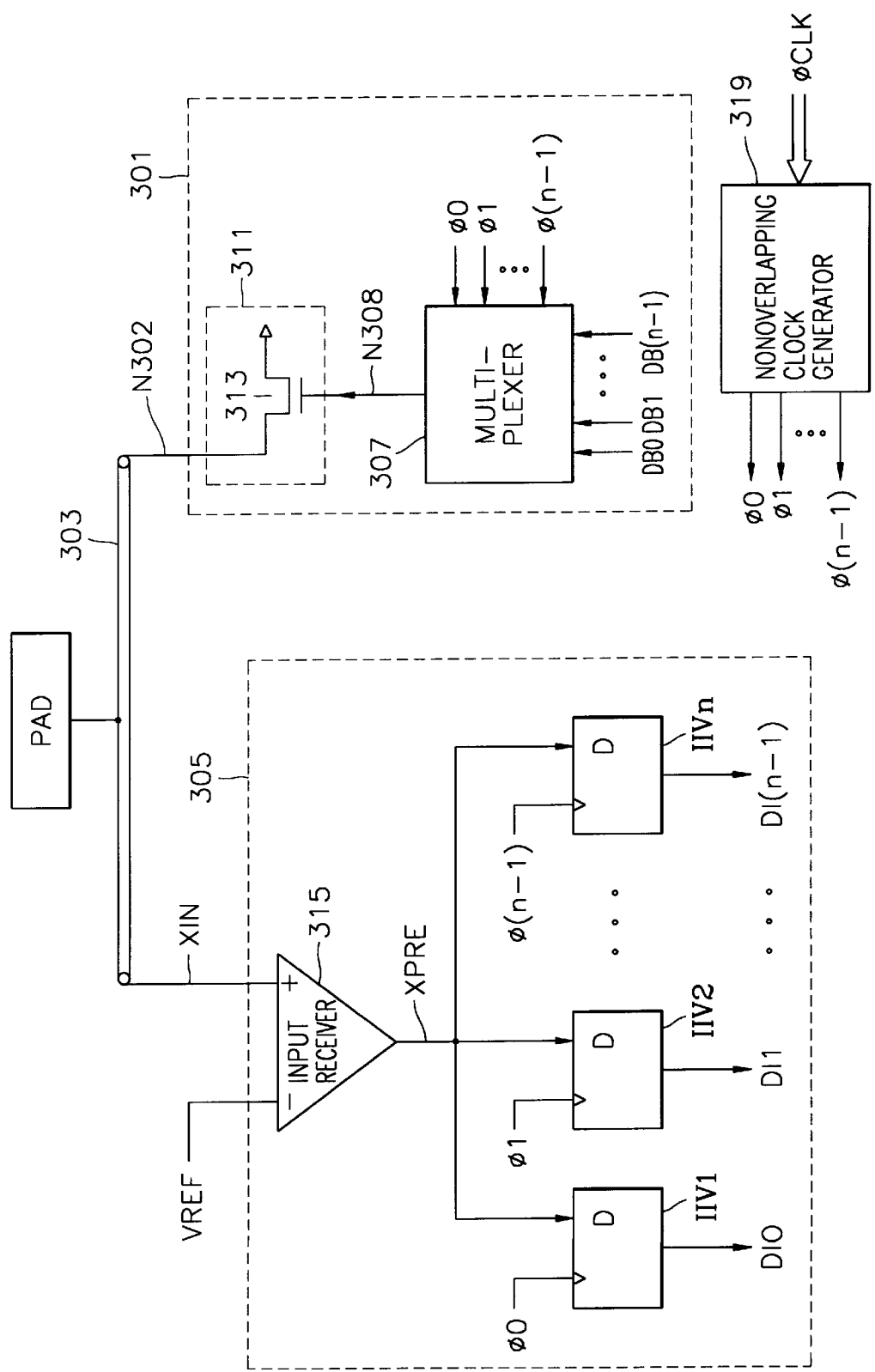
FIG. 3 is a schematic of a first preferred embodiment of a data transfer circuit according to the present invention.

Referring to FIG. 3, a first preferred embodiment of a data transfer circuit according to the present invention includes a non-overlapping clock generator 319, a data output circuit 301, a conductor 303, and a data input circuit 305.

The non-overlapping clock generator 319 generates a plurality of non-overlapping clock signals Ø0, Ø1, . . . , Ø(n−1), each of which is active during a different time interval. The data output circuit 301 selects an internal data signal from a plurality of internal data signals DB0, DB1, . . . , DB(n−1) in response to each of the non-overlapping clock signals Ø0, Ø1, . . . , Ø(n−1) and then outputs a selected internal data signal as an output data signal. The conductor 303 has two ends, one of which is connected to the data output circuit 301 in order to provide for the transmission of the output data signal of the data output circuit 301 to other components of the data transfer circuit. The data input circuit 305 has an input terminal connected to the other end of conductor 303 and selectively inputs the ouput data signal from the conductor 303 to a semiconductor memory device in response to the non-overlapping clock signals Ø0, Ø1, . . . , Ø(n−1). In other words, the data transfer circuit of the present invention is structured such that the ouput data signals generated by the data output circuit 301 according to the non-overlapping clock signals are received by the data input circuit 305 through the conductor 303.

Specifically, the data output circuit 301 includes a multiplexer 307 and a driver 311. The multiplexer 307 receives a plurality of internal data signals DB0, DB1, . . . , DB(n−1) as input signals and selects one of the internal data signals using the non-overlapping clock signals Ø0, Ø1, . . . , Ø(n−1). The selected internal data signal is transmitted through a multiplexer output terminal N308.

In operation, when one of the non-overlapping clock signals is activated, a corresponding internal data signal DB0, DB1 . . . , DB(n−1) is selected, and that selected internal data signal is transmitted to the multiplexer output terminal N308 of the multiplexer 307 as an output signal.

The driver 311 has a driver output terminal N302 connected to one end of conductor 303 and an input terminal connected to the multiplexer output terminal N308 of the multiplexer 307. The driver 311 is driven by the output signal of the multiplexer 307. According to one embodiment, the driver 311 includes a MOS transistor 313. The MOS transistor 313 has a drain connected to the conductor 303 through the driver output terminal N302, a source connected to a ground voltage, and a gate connected to the multiplexer output terminal N308 of the multiplexer 307. The driver 311 is turned on or off, and thereby communicates a driver output signal to the conductor 303, in response to the selected selected internal data signal which becomes the output signal of the multiplexer 307.

In operation, when the output signal of the multiplexer 307 is low, the MOS transistor 313 is turned off. The logic state of the conductor 303, however, depends on an external signal. The conductor 303 can be made to be logic high by being connected to a power supply voltage (not shown) and a resistor (not shown) having a high resistance. When the output signal of the multiplexer 307 is logic high, the MOS transistor 313 is turned on and he conductor 303, when connected as described above, becomes logic low. In other embodiments, the MOS transistor 313 may be replaced with a PMOS transistor or a standard push-pull driver. The driver 311 may also include an NMOS transistor.

In summary, according to the present invention, the data output circuit 301 selects one of the plurality of internal data signals DB0, DB1, . . . , DB(n−1), using an active one of the non-overlapping clock signals Ø0, Ø1, . . . , Ø(n−1) and outputs the selected internal data signal to the conductor 303 through an output terminal N302.

The data input circuit 305 includes an input receiver 315 and a plurality of internal input means 317a, 317b, . . . , 317n. The input receiver 315 receives a predetermined reference voltage VREF from an external source and an external data signal XIN from the conductor 303. The input receiver 315 is a comparator which has an inverting input terminal (−) to which the reference voltage VREF is applied, and a non-inverting input terminal (+) to which the external data signal XIN is applied. The input receiver 315 compares the external data signal XIN to the reference voltage VREF in order to generate a pre-data signal XPRE by amplifying a difference between the external data signal and the reference voltage. When the voltage of the external data signal XIN is higher than the reference voltage VREF, the pre-data signal XPRE, which is output from the input receiver 315, is high. Conversely, when the voltage of the external data signal XIN is lower than the reference voltage VREF, the pre-data signal XPRE is low.

The plurality of internal input means 317a, 317b, . . . , 317n then transmit the pre-data signal XPRE to the semiconductor memory in response to the plurality of non-overlapping clock signals Ø0, Ø1, . . . , Ø(n−1), respectively. The internal input means 317a, 317b, . . . , 317n each include a D flip-flop. Each D flip-flop has a data D input connected to the pre-data signal XPRE and a clock input connected to a respective one of the non-overlapping clock signals Ø0, Ø1 . . . , Ø(n−1). Therefore, when one of the non-overlapping clock signals is active, the D flip-flop connected to the active non-overlapping clock signal outputs the same logic level as the pre-data signal XPRE from its non-inverting output.

In operation, when the non-overlapping clock signal Ø0 is active, a first D flip-flop 317a operates and outputs the same logic level as the pre-data signal XPRE as a first final output signal DIO to other circuits of the memory. Correspondingly, since all the clock signals except Ø0 are inactive, the pre-data signal XPRE is not output from any of the other D flip-flops 317b, ..., 317n. Similarly, when the non-overlapping clock signal Ø1 is active, the second D flip-flop 317b operates and outputs the same logic level as the pre-data signal XPRE as a second final output signal DI1 to other circuits of the memory.

In summary, the data input circuit 305 has an input terminal connected to the conductor 303 to receive an external input signal (the selected internal data signal) from the data output circuit 301, and outputs a corresponding final output signal to other circuits of the memory through a predetermined D flip-flop selected by the activation of a predetermined non-overlapping clock signal. Accordingly, the data transfer circuit of the present invention transmits a predetermined internal data signal, as selected by the non-overlapping clock signals, to other circuits of the memory through the predetermined D flip-flop which is also selected by the non-overlapping clock signals.

In particular, when the clock signal Ø0 is active, a first internal data signal DB0 is selected in the data ouput circuit 301 and generated as the first final output signal DI0 from the data input circuit 305 which is transmitted to other circuits of the memory. Similarly, when the clock signal Ø1 is active, a second internal data signal DB1 is selected and generated as the final output signal DI1 which is transmitted to another circuit of the memory. Hence, the data transfer circuit of the present invention may transmit a plurality of data signals for every reference clock cycle.

Figure 4:
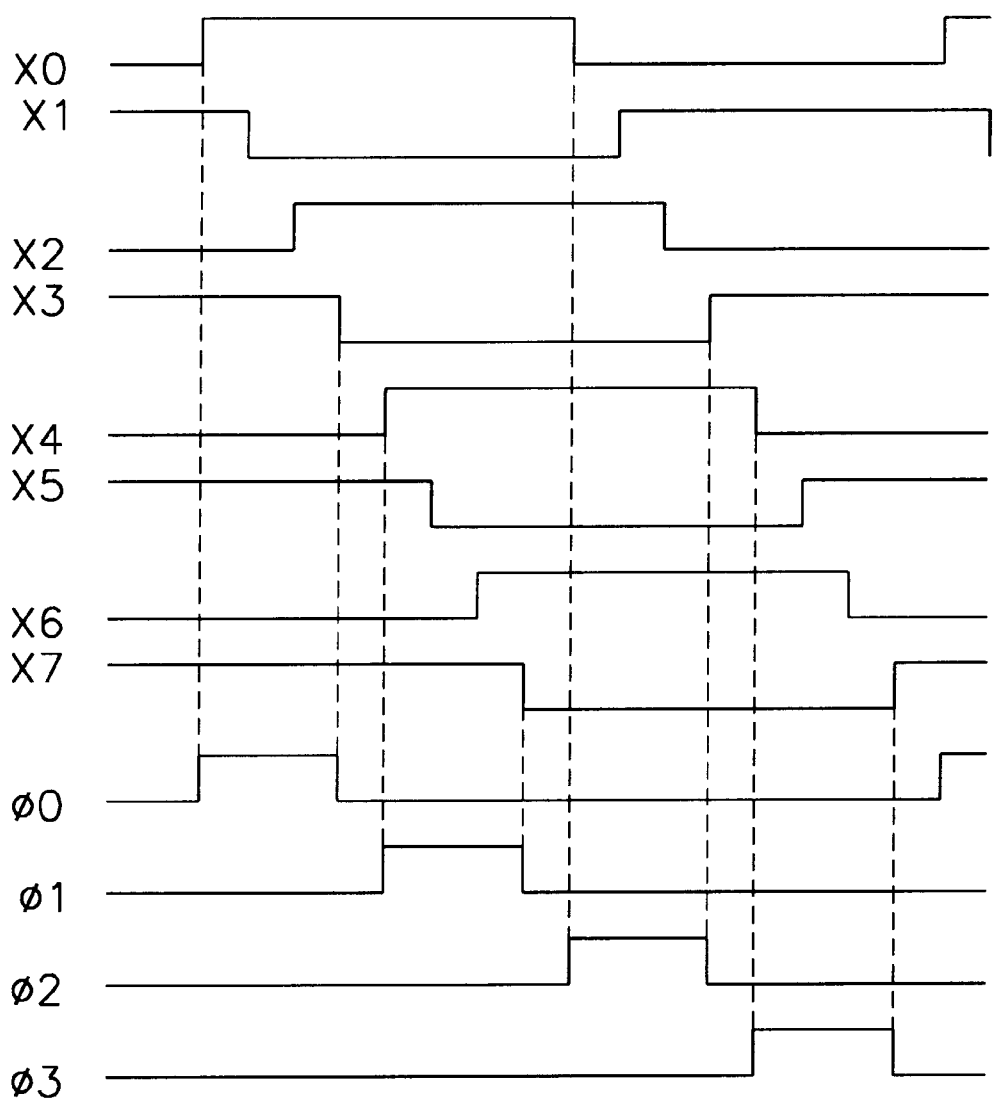
FIG. 4 is a schematic of a second and most preferred embodiment of a data transfer circuit according to the present invention.

FIG. 4 shows a second and most preferred embodiment of a data transfer circuit according to the present invention. Referring to FIG. 4, the data transfer circuit of this second embodiment is equivalent to that of the first embodiment, except for the structure of a data output circuit 401.

In this embodiment, the data output circuit 401 includes a latch 409, in addition to a multiplexer 407 and a driver 411. Similar to the first embodiment, the multiplexer 407 receives a plurality of internal data signals DB0, ..., DB(n-1) as input signals and generates a selected internal data signal, as selected by an active one of the non-overlapping clock signals Ø0, Ø1, ..., Ø(n-1). The selected internal data signal is then output through a multiplexer output terminal N408.

Unlike the first embodiment, however, the latch 409, which is absent in the first embodiment, latches the selected internal data signal output from the multiplexer output terminal N408 to produce a latched signal from a latch output terminal N410. The driver 411 is similar to the driver 311 explained in the first embodiment, and shown in FIG. 3. Specifically, the driver 411 of this second embodiment has an output terminal N402 (i.e. a transistor drain) connected to the conductor 403 and an input terminal (i.e. a transistor gate) connected to the latch output terminal N410 of the latch 409. The driver 411 is thereby driven by the latched signal received from the latch 409 to produce a driver output corresponding to the latched signal.

The latch 409 between the multiplexer 407 and the driver 411 relaxes restrictions on the design of the non-overlapping clock generator. When the latch 409 is not employed, edges of the non-overlapping clock signals must exactly coincide with those of the plurality of internal data signals DB0, DB1 ..., DB(n-1) in order to produce a valid interval. If the edges of the clock signals do not coincide precisely, an invalid interval is generated and unnecessary power is consumed for maintaining the data.

Other than the differences resulting from the addition of the latch 409, however, the structure and operation of the data transfer circuit in the second embodiment are same as those of the first embodiment. Furthermore, in both the first and second embodiments, the non-overlapping clock signals may be generated in various ways. One way is to use a phase locked loop (PLL).

Figure 5:
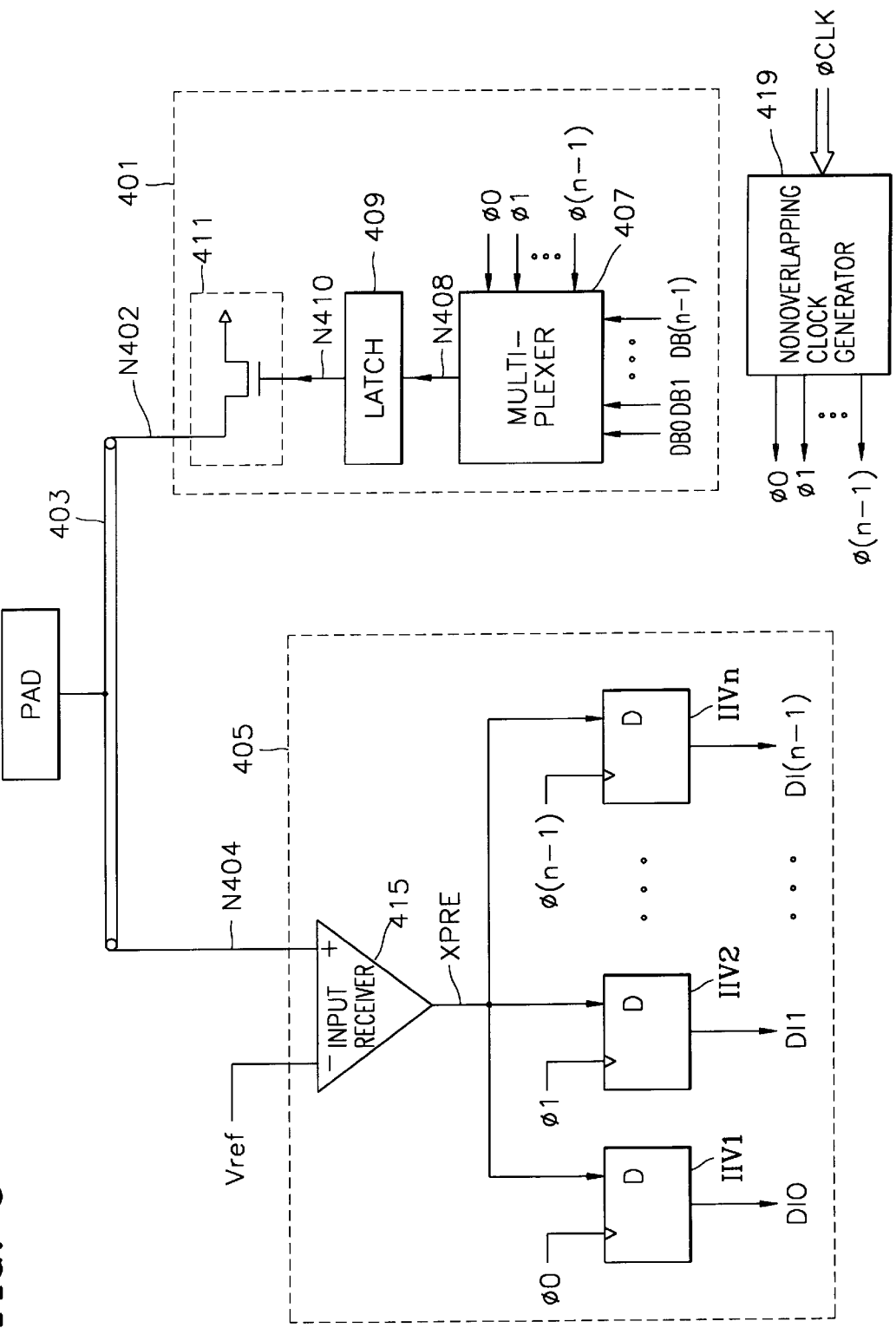
FIG. 5 is a schematic showing a preferred embodiment of a non-overlapping clock generator as used in the data transfer circuits illustrated in FIGS. 3 and 4., the non-overlapping clock generator using a phase locked loop (PLL)

FIG. 5 shows an embodiment of a non-overlapping clock generator using a PLL which may be incorporated in both the first and second embodiments of the present invention depicted in FIGS. 3 and 4, respectively. Referring to FIG. 5, four non-overlapping clock signals Ø0, Ø1, Ø2, and Ø3 are generated by the non-overlapping clock generator illustrated. The non-overlapping clock generator includes a phase frequency sensor 501, a charge pump 503, a voltage controlled oscillator 505, and a decoder 507.

Figure 6:
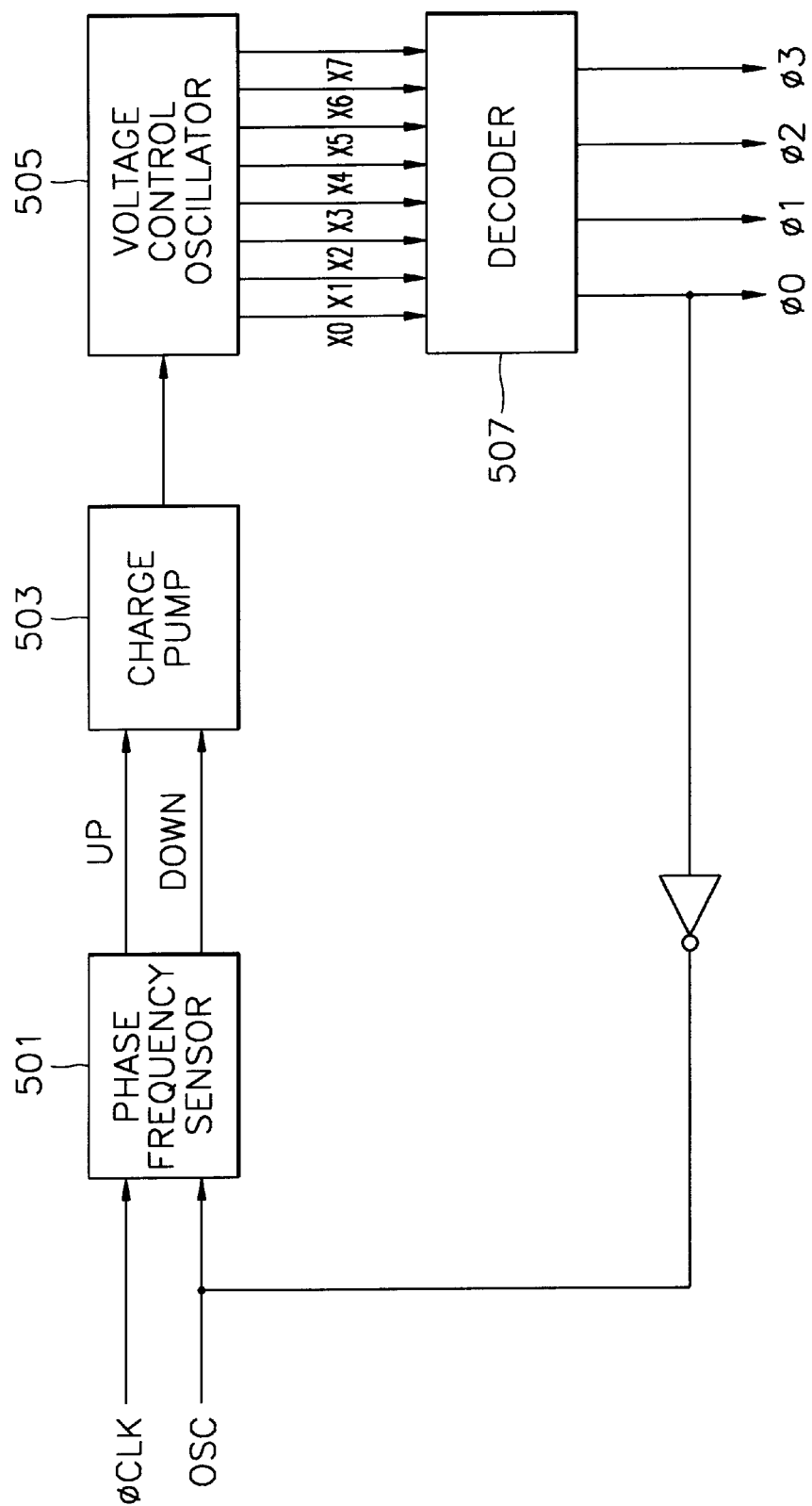
FIG. 6 is a schematic showing a phase frequency detector as used in the non-overlapping clock generator depicted in FIG. 5.

FIG. 6 shows an embodiment of the phase frequency sensor 501 as used in the non-overlapping clock generator shown in FIG. 5. Referring to FIGS. 5 and 6, the phase frequency sensor 501 compares a reference clock signal ØCLK with the phase and frequency of an inverted signal OSC of the non-overlapping clock signal Ø0 in order to generate first and second pump control signals UP and DOWN, respectively.

Specifically, when the falling edges of the reference clock signal ØCLK occur earlier than those of the inverted signal OSC, the first pump control signal UP is set to low (activated) until the falling edges of the inverted signal OSC and the reference clock signal ØCLK coincide. On the other hand, when the falling edges of the reference clock signal ØCLK occur later than those of the inverted signal OSC, the second pump control signal DOWN is set to low (activated) until the falling edges of the inverted signal OSC and the reference clock signal ØCLK coincide. Finally, when the phase of the reference clock signal ØCLK is the same as that of the inverted signal OSC, the first and second pump control signals UP and DOWN are both set to high (deactivated).

Figure 7:
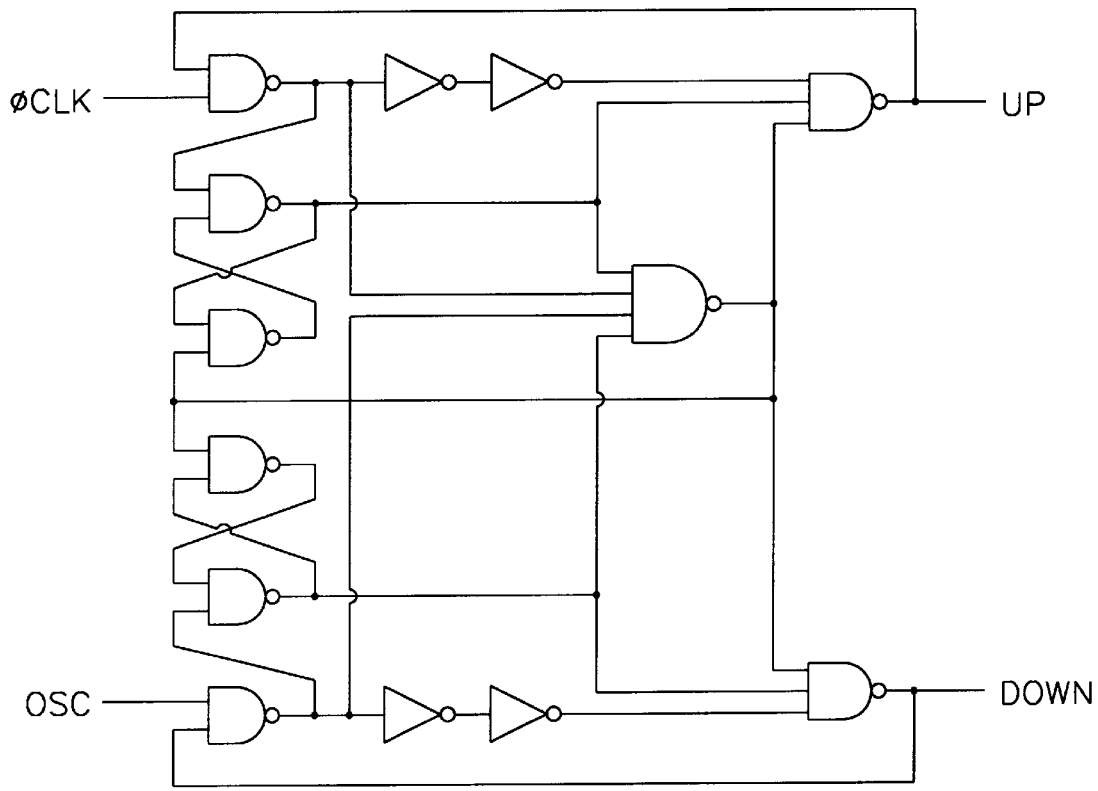
FIG. 7 is a schematic showing an embodiment of a charge pump as used in the non-overlapping clock generator shown in FIG. 5.

FIG. 7 shows an embodiment of the charge pump 503 used in the non-overlapping clock generator illustrated in FIG. 5. Referring to FIG. 7, the charge pump includes three inverters 701, 703, and 705, a PMOS switch transistor 707, an NMOS switch transistor 709, and an RC filter 711. According to this configuration, when the first pump control signal UP is activated to low and the second pump control signal DOWN is deactivated to high, the voltage of an oscillator control signal XVCO—the output signal of the charge pump—rises. When the first pump control signal UP is deactivated to high and the second pump control signal DOWN is activated to low, however, the voltage of the oscillator control signal XVCO falls. When the first and second pump control signals UP and DOWN are both high, the oscillator control signal XVCO has a constant voltage.

Figure 8:
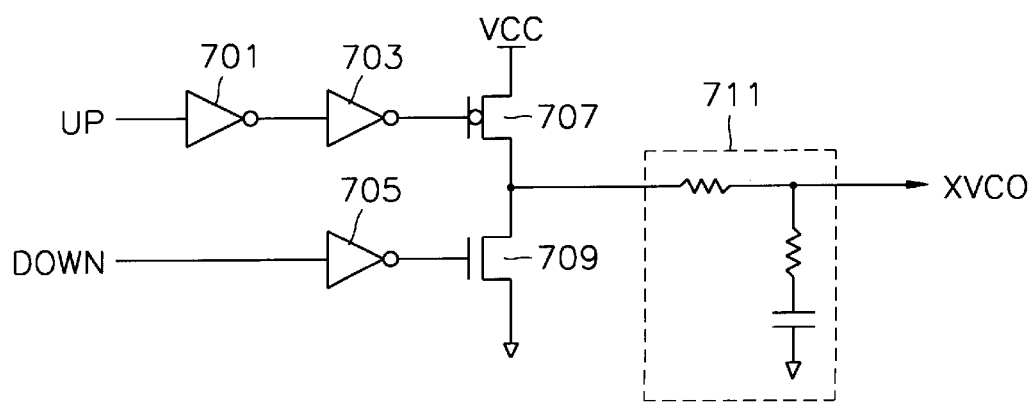
FIG. 8 is a schematic showing an embodiment of a voltage control oscillator of the non-overlapping clock generator depicted in FIG. 5.

FIG. 8 shows an embodiment of the voltage controlled oscillator 505 of the non-overlapping clock generator depicted in FIG. 5. Referring to FIG. 8, the frequency of the delayed clock signals X0, X1, ..., X7 may be controlled by the oscillator control signal XVCO.

Figure 9:
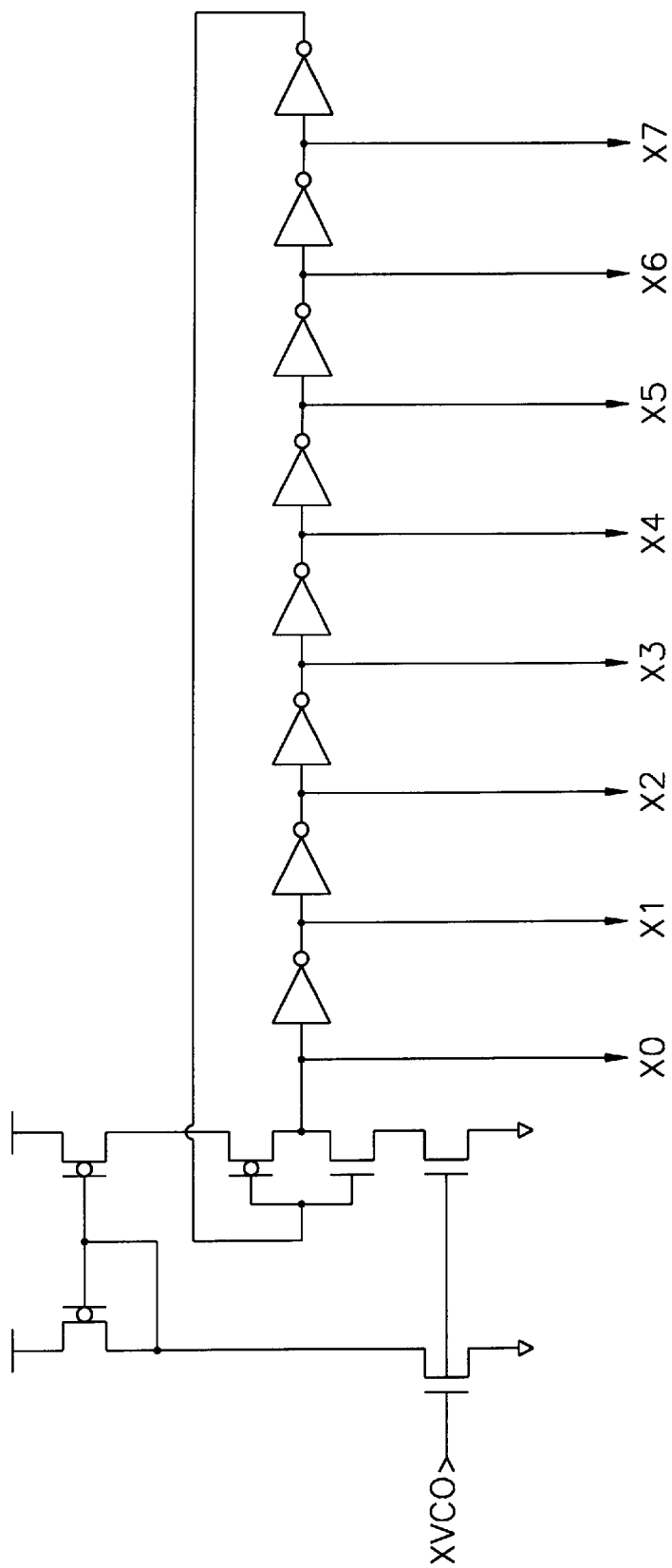
FIG. 9 is a timing diagram of selected signals within the non-overlapping clock generator depicted in FIG. 5, the timing diagram demonstrating the functioning of the non-overlapping clock generator.

Referring back to FIG. 5, the decoder 507 uses the delayed clock signals X0, X1, ..., X7 to generate the non-overlapping clock signals Ø0, Ø1, Ø2 and Ø3 based on the timing relationships shown in FIG. 9.

Referring now to FIG. 9, four non-overlapping clock signals, together having the same frequency as the reference clock signal ØCLK, may be generated using the embodiment explained above.

By modifying the non-overlapping clock generator shown in FIGS. 5 through 9, any number "n" of non-overlapping clock signals may be generated. By using the non-overlapping clock generator which uses a PLL, the non-overlapping clock signals are exactly synchronized with the reference clock signal and are active during precise divisions of the reference clock signal's duration.

In summary, the data transfer circuit according to the present invention includes a non-overlapping clock generator, a data output circuit, and a data input circuit. The non-overlapping clock generator generates a plurality of non-overlapping clock signals, each of which is active at a different time during one cycle of an external reference clock signal. The data output circuit selectively outputs a plurality of internal data signals in response to the non-overlapping clock signals, and the data input circuit transmits the data received from the data output circuit to another circuit of the memory, also in response to the non-overlapping clock signals.

According to the data transfer circuit and the data transfer method of the present invention, therefore, a plurality of data words are processed during one cycle of an external clock signal. This circuit and method thereby improves data processing speed by providing for multiple operations during a single clock cycle, while additionally significantly reducing power consumption, because only one input receiver is required.

This invention is not limited to the illustrated embodiments and changes and modifications can be made within the scope of the invention as claimed which will be apparent to persons skilled in the art. The following claims are the sole limit on the scope of the invention.

What is claimed is:

1. A data input circuit in a semiconductor memory which is synchronized with a reference clock, the data input circuit comprising:
    a non-overlapping clock generator to generate a plurality of non-overlapping clock signals, each of which is active during a different time interval;
    an input receiver to receive a predetermined reference voltage and an external data signal and to compare the external data signal to the reference voltage in order to output a pre-data signal to a plurality of internal input means; and
    the plurality of internal input means each configured to receive the pre-data signal and to output the pre-data signal to the semiconductor memory in response to a respective one of the non-overlapping clock signals.

2. The data input circuit of claim 1, wherein each of the non-overlapping clock signals comprises a rising edge and a falling edge that do not coincide with either the rising edge or the falling edge of any of the other non-overlapping clock signals.

3. The data input circuit of claim 1, wherein each of the internal input means comprises a D flip-flop having a data input connected to the pre-data signal and a clock input connected to the respective one of the non-overlapping clock signals, such that when the respective one of the non-overlapping clock signals is active, the D flip-flop connected thereto outputs the pre-data signal.

4. A data output circuit in a semiconductor memory which is synchronized with a reference clock, the data output circuit comprising:
    a non-overlapping clock generator which generates a plurality of non-overlapping clock signals, wherein each of the non-overlapping clock signals comprises a rising edge and a falling edge that do not coincide with either the rising edge or the falling edge of any of the other non-overlapping clock signals;
    a multiplexer which receives a plurality of internal data signals, selects one of the plurality of internal data signals according to the non-overlapping clock signals, and outputs a selected internal data signal through a multiplexer output terminal; and
    a driver which receives the selected internal data signal from the multiplexer output terminal and produces a driver output corresponding to the selected internal data signal.

5. The data output circuit of claim 4, wherein the multiplexer receives the non-overlapping clock signals and selects and outputs the internal data signal which corresponds to an active one of the non-overlapping clock signals.

6. The data output circuit of claim 4, wherein the driver includes a MOS transistor having a drain connected to a driver output terminal, a source connected to a ground voltage, and a gate connected to the multiplexer output terminal, the MOS transistor being turned on or off in response to the selected internal data signal received from the multiplexer.

7. A data output circuit in a semiconductor memory which is synchronized with a reference clock, comprising:
    a non-overlapping clock generator to generate a plurality of non-overlapping clock signals, wherein each of the non-overlapping clock signals comprises a rising edge and a falling edge that do not coincide with either the rising edge or the falling edge of any of the other non-overlapping clock signals;
    a multiplexer to receive a plurality of internal data signals, to select one of the internal data signals according to an active one of the non-overlapping clock signals, and to output a selected internal data signal through a multiplexer output terminal;
    a latch to receive the selected internal data signal from the multiplexer output terminal, to latch the selected internal data signal, to produce a latched signal, and to transmit the latched signal through a latch output terminal; and
    a driver to receive the latched signal from the latch output terminal and to produce a driver output corresponding to the latched signal.

8. The data output circuit of claim 7, wherein the multiplexer receives the non-overlapping clock signals and outputs a selected one of the internal data signals which corresponds to the active one of the non-overlapping clock signals as the selected internal data signal.

9. The data output circuit of claim 7, wherein the driver includes a MOS transistor having a drain connected to a driver output terminal, a source connected to a ground voltage, and a gate connected to the latch output terminal, the MOS transistor being turned on or off in response to the latched signal.

10. A data transfer circuit in a semiconductor memory synchronized with a reference clock, the data transfer circuit comprising:
    a non-overlapping clock generator to generate a plurality of non-overlapping clock signals, wherein each of the non-overlapping clock signals comprises a rising edge and a falling edge that do not coincide with either the rising edge or the falling edge of any of the other non-overlapping clock signals;
    a data output circuit to selectively output one of a plurality of internal data signals as a selected internal data signal in response to an active one of the non-overlapping clock signals;
    a conductor which is connected to an output terminal of the data output circuit to receive the selected internal data signal; and
    a data input circuit having an input terminal connected to the conductor, the data input circuit configured to selectively receive an external input signal corresponding to the selected internal data signal from the conductor in response to the active one of the non-overlapping clock signals.

11. The data transfer circuit of claim 10, wherein the data input circuit comprises:

an input receiver which receives a predetermined reference voltage and the external data signal and which compares the external data signal to the reference voltage to generate a pre-data signal; and a plurality of internal input means, each of which receives the pre-data signal from the input receiver and outputs the pre-data signal to the semiconductor memory in response to a respective one of the non-overlapping clock signals.

12. The data transfer circuit of claim 11, wherein the input receiver is a comparator having an inverting input connected to the reference voltage and a non-inverting input connected to the external data signal, the input receiver amplifying a difference between the external data signal and the reference voltage.

13. The data transfer circuit of claim 11, wherein each of the internal input means includes a D flip-flop having a data input connected to the pre-data signal and a clock input connected to one of the respective one of the non-overlapping clock signals, and a predetermined D flip-flop outputting the pre-data signal when a predetermined non-overlapping clock signal is active.

14. The data transfer circuit of claim 10, wherein the data output circuit comprises:

a multiplexer which receives a plurality of internal data signals and outputs one of the internal data signals as a selected internal data signal being selected by an active one of the non-overlapping clock signals;

a latch which latches the selected internal data signal received from the multiplexer to produce a latched output from a latch output terminal; and a driver which receives the latched signal from the latched output terminal and outputs a data output signal.

15. The data transfer circuit of claim 14, wherein the multiplexer receives the non-overlapping clock signals, and outputs one of the internal data signals which corresponds to the active one of the non-overlapping clock signals as the selected internal data signal.

16. The data transfer circuit of claim 14, wherein the driver includes a MOS transistor having a gate connected to the latch output terminal, the MOS transistor being turned on or off in response to the latched signal.

17. A method of inputting data into a semiconductor memory which is synchronized with a reference clock, the method comprising the steps of:

generating a plurality of non-overlapping clock signals, wherein each of the non-overlapping clock signals comprises a rising edge and a falling edge that do not coincide with either the rising edge or the falling edge of any of the other non-overlapping clock signals;

receiving and comparing a predetermined reference voltage and an external data signal to generate a pre-data signal; and outputting the pre-data signal to the semiconductor memory in response to the non-overlapping clock signals.

18. A method of outputting data from a semiconductor memory which is synchronized with a reference clock, the method comprising the steps of:

generating a plurality of non-overlapping clock signals, wherein each of the non-overlapping clock signals comprises a rising edge and a falling edge that do not coincide with either the rising edge or the falling edge of any of the other non-overlapping clock signals;

multiplexing a plurality of internal data signals to output a selected one of the internal data signals which is selected in response to an active one of the non-overlapping clock signals; and driving a driver in response to the selected one of the internal data signals.

19. A method of outputting data from a semiconductor memory which is synchronized with a reference clock, the method comprising the steps of:

generating a plurality of non-overlapping clock signals, wherein each of the non-overlapping clock signals comprises a rising edge and a falling edge that do not coincide with either the rising edge or the falling edge of any of the other non-overlapping clock signals;

multiplexing a plurality of internal data signals to output a selected one of the internal data signals which is selected in response to an active one of the non-overlapping clock signals;

latching the selected one of the internal data signals to produce a latched signal; and driving a driver in response to the latched signal.

20. A method of transferring data to and from a semiconductor memory which is synchronized with a reference clock, the method comprising the steps of:

generating a plurality of non-overlapping clock signals, wherein each of the non-overlapping clock signals comprises a rising edge and a falling edge that do not coincide with either the rising edge or the falling edge of any of the other non-overlapping clock signals;

selecting one of a plurality of internal data signals in response to an active one of the non-overlapping clock signals;

transmitting a selected one of the internal data signals to another circuit; and selectively receiving the selected one of the internal data signals in response to the active one of the non-overlapping clock signals.

21. The method of transferring data of claim 20, wherein the step of selectively receiving data further comprises the steps of:

receiving and comparing a predetermined reference voltage and the selected one of the internal data signals to generate a pre-data signal; and outputting the pre-data signal to a semiconductor memory in response to the active one of the non-overlapping clock signals.

22. The method of transferring data according to claim 20, wherein the step of selecting one of the internal data signals comprises the substeps of:

multiplexing the plurality of internal data signals to output the selected one of the internal data signals which is selected according to the active one of the non-overlapping clock signals; and driving a driver in response to the selected one of the internal data signals.

23. The method of transferring data according to claim 20, wherein the step of selecting one of the internal data signals comprises the substeps of:

multiplexing the plurality of internal data signals to output a selected one of the internal data signals which is selected according to the active one of the non-overlapping clock signals;

latching the selected one of the internal data signals to produce a latched signal; and driving a driver in response to the latched signal.

* * * * *

UNITED STATES PATENT AND TRADEMARK OFFICE
CERTIFICATE OF CORRECTION

PATENT NO. : 6,130,558
DATED : October 10, 2000
INVENTOR(S) : Lee

It is certified that error appears in the above-identified patent and that said Letters Patent is hereby corrected as shown below:

Column 4,
Line 11, "selected selected" should read -- selected --.
Line 20, "and he conductor" should read -- and the conductor --.

Column 5,
Line 38, "DB0,..., DB(n-1)" should read -- DB0, DB1, ..., DB(n-1) --.

Signed and Sealed this

Sixteenth Day of April, 2002

Attest:

JAMES E. ROGAN
Attesting Officer    Director of the United States Patent and Trademark Office